(12) United States Patent
Butler et al.

(10) Patent No.: US 10,248,027 B2
(45) Date of Patent: Apr. 2, 2019

(54) PROJECTION SYSTEM

(71) Applicant: ASML Netherlands B.V., Veldhoven (NL)

(72) Inventors: Hans Butler, Veldhoven (NL); Raoul Maarten Simon Knops, Veldhoven (NL); Bob Streefkerk, Veldhoven (NL); Christiaan Louis Valentin, Veldhoven (NL); Jan Bernard Plechelmus Van Schoot, Veldhoven (NL); Wilhelmus Franciscus Johannes Simons, Veldhoven (NL); Leon Leonardus Franciscus Merkx, Veldhoven (NL); Robertus Johannes Marinus De Jongh, Veldhoven (NL); Roel Johannes Elisabeth Merry, Veldhoven (NL); Michael Frederik Ypma, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/525,610

(22) PCT Filed: Nov. 16, 2015

(86) PCT No.: PCT/EP2015/076637
§ 371 (c)(1),
(2) Date: May 10, 2017

(87) PCT Pub. No.: WO2016/087177
PCT Pub. Date: Jun. 9, 2016

(65) Prior Publication Data
US 2017/0363965 A1    Dec. 21, 2017

(30) Foreign Application Priority Data

Jan. 12, 2014    (EP) .................................... 14195648

(51) Int. Cl.
*G03F 7/20*    (2006.01)
(52) U.S. Cl.
CPC .......... *G03F 7/70258* (2013.01); *G03F 7/705* (2013.01); *G03F 7/706* (2013.01); *G03F 7/70266* (2013.01)
(58) Field of Classification Search
CPC ........................ G03F 7/70258; G03F 7/70266
See application file for complete search history.

(56) References Cited

U.S. PATENT DOCUMENTS 5,721,641 A  *  2/1998  Aoki ...................... G02B 15/17
                                                        359/554
6,549,270 B1    4/2003  Ota
(Continued)

FOREIGN PATENT DOCUMENTS

WO    WO 2012126364 A1  *  9/2012 ......... G03F 7/70725

OTHER PUBLICATIONS

International Search Report and Written Opinion of the International Searching Authority directed to related International Patent Application No. PCT/EP2015/076637, dated Feb. 22, 2016; 9 pages.

*Primary Examiner* — Michelle M Iacoletti
(74) *Attorney, Agent, or Firm* — Sterne, Kessler, Goldstein & Fox P.L.L.C.

(57) ABSTRACT

A projection system (PS1) for a lithographic apparatus comprises: an optical path (100); a plurality of sensors (S1-S4); one or more actuators (A1-A4); and a controller (CN). The optical path is operable to receive an input radiation beam (Bin) and to project an output radiation beam (Bout) onto a substrate to form an image. The optical path comprises: a plurality of optical elements (M1-M4), the plurality of optical elements comprising: a first set of at least two optical elements (M1, M4) and a second set of at least one optical element (M2, M3). Each sensor is associated (Continued)

with one of the plurality of optical elements and is operable to determine a position of that optical element. Each actuator is associated with one of the second set of optical elements and is operable to adjust that optical element. The controller is operable to use the one or more actuators to adjust the second set of optical elements in dependence on the determined position of the first set of optical elements so as to at least partially compensate for optical aberrations and/or line-of-sight errors caused by the positions of the first set of optical elements.

21 Claims, 5 Drawing Sheets

(56) References Cited

U.S. PATENT DOCUMENTS

| | | |
|---|---|---|
| 2002/0011573 A1 | 1/2002 | Van Dijsseldonk et al. |
| 2004/0257549 A1 | 12/2004 | Leenders et al. |
| 2006/0023179 A1 | 2/2006 | Tschischgale et al. |
| 2006/0139598 A1 | 6/2006 | Van Dijsseldonk et al. |
| 2009/0115988 A1* | 5/2009 | Takeshita ............... G03B 27/54 355/67 |
| 2010/0134768 A1 | 6/2010 | Hetzler et al. |
| 2011/0164232 A1* | 7/2011 | Freimann ............ G03F 7/70258 355/67 |
| 2012/0044468 A1 | 2/2012 | Streefkerk et al. |
| 2014/0016108 A1 | 1/2014 | Freimann et al. |
| 2014/0176927 A1 | 6/2014 | Kwan |
| 2015/0062596 A1* | 3/2015 | Kwan ................. G03F 7/70825 356/614 |

* cited by examiner

PROJECTION SYSTEM

CROSS-REFERENCE TO RELATED APPLICATIONS

This application claims priority of EP14195648.2 which was filed on Dec. 1, 2014 and which is incorporated herein in its entirety by reference.

FIELD

The present invention relates to a projection system for a lithographic apparatus and an associated method of controlling a projection system.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate. This may be achieved using a projection system.

The wavelength of radiation used by a lithographic apparatus to project a pattern onto a substrate determines the minimum size of features which can be formed on that substrate. A lithographic apparatus which uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

It is desirable to increase the accuracy with which a lithographic apparatus applies a desired pattern to a substrate and to reduce optical aberrations that can cause distortion of the pattern.

It is an object of the present invention to provide a projection system for a lithographic apparatus that at least partially addresses one or more of the problems of the prior art, whether identified herein or elsewhere.

SUMMARY

According to a first aspect of the present invention there is provided a projection system for a lithographic apparatus, the projection system comprising: an optical path that is operable to receive an input radiation beam and to project an output radiation beam onto a substrate to form an image, the optical path comprising a plurality of optical elements, the plurality of optical elements comprising: a first set of at least two optical elements and a second set of at least one optical element; a plurality of sensors, each sensor being associated with one of the plurality of optical elements and operable to determine a position of that optical element; one or more actuators, each actuator being associated with one of the second set of optical elements and operable to adjust that optical element; and a controller, wherein the controller is operable to use the one or more actuators to adjust the second set of optical elements in dependence on the determined position of the first set of optical elements so as to at least partially compensate for optical aberrations and/or line-of-sight errors caused by the positions of the first set of optical elements.

Advantageously, such an arrangement allows optical aberrations that are caused by the positions of the first set of optical elements to be at least partially corrected for by adjusting the second set of optical elements. This may be particularly advantageous if the positions of a first set of optical elements cannot be controlled or, alternatively, if the positions of a second set of optical elements can be controlled more accurately and/or with a higher bandwidth than the positions of the first set of optical elements.

The controller may be operable to use a model to: determine an optical aberration caused by the positions of the first set of optical elements; and determine an adjustment for the second set of optical elements that at least partially compensates for the determined optical aberration.

The adjustment determined by the controller may comprise a change in position of the or each optical element of the second set of optical elements. The determined positions for each of the second set of optical elements may be determined in terms of deviations from their nominal positions.

One or more of the second set of optical elements may be an adjustable optical element. The adjustment determined by the controller may comprise a change in the shape of the or each adjustable optical element.

The projection system may further comprise a sensor frame. Each of the plurality of sensors may be operable to determine a position of its associated optical element relative to the sensor frame. A global movement of the plurality of optical elements may result in a shift of the output radiation beam that is projected onto the substrate. Movement of any of the optical elements relative to the other optical elements can cause an optical aberration. Determining the position of each optical element relative to the sensor frame allows both global shifts of all of the optical elements and relative movements of the optical elements to be determined.

Additionally or alternatively, each of the plurality of sensors may be operable to determine a position of its associated optical element relative to one or more other of the plurality of optical elements.

The controller may be operable to receive a signal from each sensor that is indicative of the position of its corresponding optical element.

The controller may be operable to generate and output a signal to each actuator so as to cause a determined adjustment to be applied to its associated optical element.

Each of the plurality of sensors may have a sample rate that is least twice the highest resonant eigen-frequency of its associated optical element. Advantageously, this avoids any aliasing effects of the sampling.

The projection system may further comprise an actuator associated with each of the first set of optical elements that is operable to adjust that optical element.

The first set of optical elements may each have a control bandwidth that is at least a factor of two lower than each of the second set of optical elements.

Each optical element may comprise a mirror.

The optical path may comprise six or more mirrors.

According to a second aspect of the present invention there is provided a lithographic apparatus comprising: an illumination system configured to condition a radiation beam; a support structure constructed to support a patterning device, the patterning device being capable of imparting the radiation beam with a pattern in its cross-section to form a patterned radiation beam; a substrate table constructed to hold a substrate; and a projection system according to any preceding claim, configured to receive the patterned radiation beam as its input radiation beam and to project its output radiation beam onto the substrate.

Each of the plurality of sensors may have a sufficiently high sample rate that the position of each optical element is sampled a plurality of times during an exposure time period of the lithographic apparatus.

The sample rate of each sensor may be at least a factor of ten greater than the exposure rate of the lithographic apparatus.

The controller may be further operable to control the position of the substrate table and/or the support structure in dependence on the determined position of the first set of optical elements so as to at least partially compensate for alignment errors caused by the positions of the first set of optical elements.

The lithographic apparatus may further comprise a sensor that is operable to measure a wavefront of the radiation beam at the substrate level.

According to a third aspect of the present invention there is provided a method for controlling a projection system comprising a plurality of optical elements, the method comprising: determining a position of each optical element; using a model to determine an optical aberration and/or line-of-sight error caused by the positions of a first set of at least two of the plurality of optical elements; using a model to determine an adjustment for each of a second set of the plurality of optical elements that at least partially compensates for the determined optical aberration and/or line-of-sight error; and applying the determined adjustment to each of the second set of the plurality of optical elements.

The adjustment for each of the second set of the plurality of optical elements may comprise a movement of that optical element.

Additionally or alternatively, the adjustment for each of the second set of the plurality of optical elements may comprise a distortion of the shape of that optical element.

The method may further comprise applying an adjustment to the first set of optical elements.

The adjustment to the first set of optical elements may be applied at a rate that is at least a factor of two lower than a rate at which the adjustments are applied to the second set of optical elements.

The method may further comprise: measuring at least one of: an aberration, a position or an orientation of an image formed by the projection system and using the measurements to calibrate the model.

According to a fourth aspect of the invention there is provided a lithographic apparatus comprising, a patterning device support structure, a projection system, a substrate table, and a controller, wherein the projection system comprises: an optical path that is operable to receive an input radiation beam and to project an output radiation beam onto a substrate to form an image, the optical path comprising a plurality of optical elements, the plurality of optical elements comprising: a first set of at least two optical elements and a second set of at least one optical element; a plurality of sensors, each sensor being associated with one of the plurality of optical elements and operable to determine a position of that optical element; and one or more actuators, each actuator being associated with one of the second set of optical elements and operable to adjust that optical element; wherein the controller is operable to use the one or more actuators to adjust the second set of optical elements in dependence on the determined position of the first set of optical elements so as to at least partially compensate for a line-of-sight error and/or optical aberrations caused by the positions of the first set of optical elements; and wherein the controller is further operable to adjust a position of the patterning device support structure and/or the substrate table to reduce the line-of-sight error and/or the optical aberrations.

This aspect of the invention may advantageously reduce a sight error and/or optical aberration because it addresses the projection system and the patterning device support structure and/or the substrate table in combination.

The controller may be operable to reduce the line-of-sight error and/or optical aberrations by adjusting the second set of optical elements such that a residual error remains, and to then reduce the residual error by adjusting the position of the patterning device support structure.

The controller may be operable to use a model to determine a combined line-of-sight error and/or a combined optical aberration caused by the optical elements and the patterning device support structure in combination, and to adjust the second set of optical elements and adjust the position of the patterning device support structure to reduce the combined line-of-sight error and/or optical aberration.

The controller may be operable to apply feedthrough control of the substrate table such that the position of the substrate table is synchronized with the position of the patterning device support structure.

The controller may be operable to reduce the line-of-sight error and/or optical aberrations by adjusting the second set of optical elements such that a residual error remains, and to then reduce the residual error by adjusting the position of the substrate table.

The controller may be operable to use a model to determine a combined line-of-sight error and/or a combined optical aberration caused by the optical elements and the substrate table in combination, and to adjust the second set of optical elements and adjust the position of the substrate table to reduce the combined line-of-sight error and/or optical aberration.

The controller may be operable to apply feedthrough control of the patterning device support structure such that the position of the patterning device support structure is synchronized with the position of the substrate table.

The controller may be operable to reduce the line-of-sight error and/or optical aberrations such that a residual error remains, and to then reduce the residual error by adjusting the position of the patterning device support structure and adjusting the position of the substrate table.

The controller may be operable to use a model to determine a combined line-of-sight error and/or a combined optical aberration caused by the optical elements, the patterning device support structure, and substrate table in combination, and to adjust the second set of optical elements, adjust the the position of the patterning device support structure, and adjust the position of the substrate table to reduce the combined line-of-sight error and/or optical aberration.

An error in the adjusted position of the patterning device support structure and/or the adjusted position of the substrate table may be determined and used by the controller to apply a further adjustment to second set of optical elements.

The adjustment determined by the controller may comprise a change in position of the or each optical element of the second set of optical elements.

One or more of the second set of optical elements may be an adjustable optical element, and the adjustment determined by the controller may comprise a change in the shape of the or each adjustable optical element.

The lithographic apparatus may further comprise an acceleration sensor associated with at least one of the optical elements.

According to a fifth aspect of the invention there is provided a lithographic apparatus comprising, a patterning device support structure, a projection system, a substrate table, and a controller, wherein the projection system comprises: an optical path that is operable to receive an input radiation beam and to project an output radiation beam onto a substrate to form an image, the optical path comprising a plurality of optical elements; a plurality of sensors, each sensor being associated with one of the plurality of optical elements and operable to determine a position of that optical element; and a plurality of actuators, each actuator being associated with an optical element and operable to adjust that optical element; wherein the controller is operable to use the actuators to minimise relative movement between the optical elements.

The controller may further be operable to adjust the position of the patterning device support structure and/or the substrate table to at least partially compensate for net movement of the optical elements.

According to a sixth aspect of the invention there is provided a method for controlling a lithographic apparatus comprising a patterning device support structure, a projection system comprising a plurality of optical elements, and a substrate table, the method comprising determining a position of each optical element, using a model to determine a line-of-sight error and/or optical aberration caused by the positions of a first set of at least two of the plurality of optical elements; using a model to determine an adjustment for each of a second set of the plurality of optical elements, and to determine an adjustment to a position of the patterning device support structure and/or the substrate table that at least partially compensates for the determined line-of-sight error and/or the optical aberration; and applying the determined adjustment to each of the second set of the plurality of optical elements and applying the determined adjustment to the position of the patterning device support structure and/or the substrate table.

The line-of-sight error and/or optical aberration may be reduced by adjusting the second set of the plurality of optical elements, such that a residual error remains, then that residual error may be reduced by adjusting the position of the patterning device support structure.

A model may be used to determine a combined line-of-sight error and/or a combined optical aberration caused by the optical elements and the patterning device support structure in combination, and the second set of optical elements may be adjusted and the position of the patterning device support structure may be adjusted to reduce the combined line-of-sight error and/or optical aberration.

The line-of-sight error and/or optical aberration may be reduced by adjusting the second set of the plurality of optical elements, such that a residual error remains, then that residual error may be reduced by adjusting the position of the substrate table.

A model may be used to determine a combined line-of-sight error and/or a combined optical aberration caused by the optical elements and the substrate table in combination, and the second set of optical elements may be adjusted and the position of the substrate table may be adjusted to reduce the combined line-of-sight error and/or optical aberration.

The adjustment applied to the second set of optical elements may comprise a change in position of the or each optical element of the second set of optical elements.

One or more of the second set of optical elements may be an adjustable optical element and the adjustment may comprise a change in the shape of the or each adjustable optical element.

According to a seventh aspect of the invention there is provided a method for controlling a lithographic apparatus comprising a patterning device support structure, a projection system comprising a plurality of optical elements, and a substrate table, the method comprising determining a position of each optical element, and using actuators to move at least some of the optical elements in order to minimise relative movement between the optical elements.

The method may further comprise adjusting the position of the patterning device support structure and/or the substrate table to at least partially compensate for net movement of the optical elements.

Various aspects and features of the invention set out above or below may be combined with various other aspects and features of the invention as will be readily apparent to the skilled person.

BRIEF DESCRIPTION OF THE DRAWINGS

Embodiments of the invention will now be described, by way of example only, with reference to the accompanying schematic drawings, in which.

DETAILED DESCRIPTION

Figure 1:
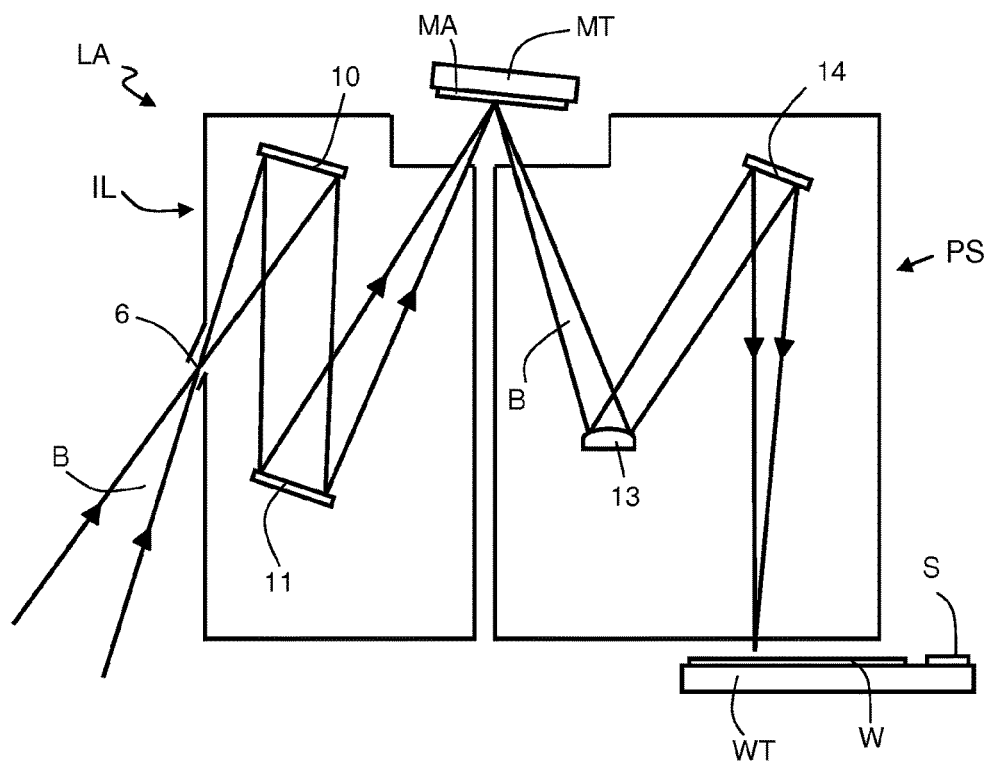
FIG. 1 depicts a lithographic apparatus comprising a projection system according to an embodiment of the invention.

FIG. 1 shows a lithographic apparatus LA including a projection system PS according to one embodiment of the invention. The lithographic apparatus LA further comprises an illumination system IL, a support structure MT configured to support a patterning device MA (e.g. a mask) and a substrate table WT configured to support a substrate W. The illumination system IL is configured to receive and condition a radiation beam B before it is incident upon the patterning device MA. The projection system PS is configured to project the radiation beam B (now patterned by the mask MA) onto the substrate W. The substrate W may include previously formed patterns. Where this is the case, the lithographic apparatus LA aligns the patterned radiation beam B with a pattern previously formed on the substrate W.

The lithographic apparatus LA may form part of a lithographic system, which further comprises a radiation source. The radiation source is configured to generate an extreme ultraviolet (EUV) radiation beam B.

In some embodiments, the lithographic apparatus LA is provided with a dedicated radiation source. That is, the lithographic system comprises one radiation source and only one lithographic apparatus. For such embodiments the radiation source may for example be a laser produced plasma (LPP) EUV radiation source.

Figure 2:
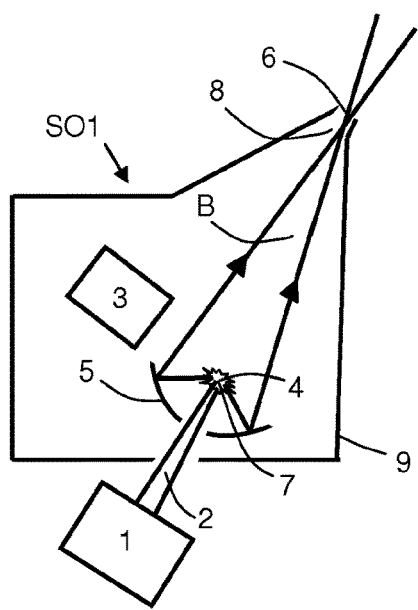
FIG. 2 depicts a radiation source that may supply radiation to the lithographic apparatus of FIG. 1.

The radiation source SO1 shown in FIG. 2 is of a type which may be referred to as a laser produced plasma (LPP) source. A laser 1, which may for example be a $CO_2$ laser, is arranged to deposit energy via a laser beam 2 into a fuel, such as tin (Sn) which is provided from a fuel emitter 3. Although tin is referred to in the following description, any suitable fuel may be used. The fuel may for example be in liquid form, and may for example be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a plasma 7 at the plasma formation region 4. Radiation, including EUV radiation, is emitted from the plasma 7 during de-excitation and recombination of ions of the plasma.

The EUV radiation is collected and focused by a near normal incidence radiation collector 5 (sometimes referred to more generally as a normal incidence radiation collector). The collector 5 may have a multilayer structure which is arranged to reflect EUV radiation (e.g. EUV radiation having a desired wavelength such as 13.5 nm). The collector 5 may have an elliptical configuration, having two ellipse focal points. A first focal point may be at the plasma formation region 4, and a second focal point may be at an intermediate focus 6, as discussed below.

The laser 1 may be separated from the radiation source SO1. Where this is the case, the laser beam 2 may be passed from the laser 1 to the radiation source SO1 with the aid of a beam delivery system (not shown) comprising, for example, suitable directing mirrors and/or a beam expander, and/or other optics. The laser 1 and the radiation source SO1 may together be considered to be a radiation system.

Radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused may be referred to as the intermediate focus. The radiation source SO1 is arranged such that the intermediate focus 6 is located at or near to an opening 8 in an enclosing structure 9 of the radiation source.

Figure 3:
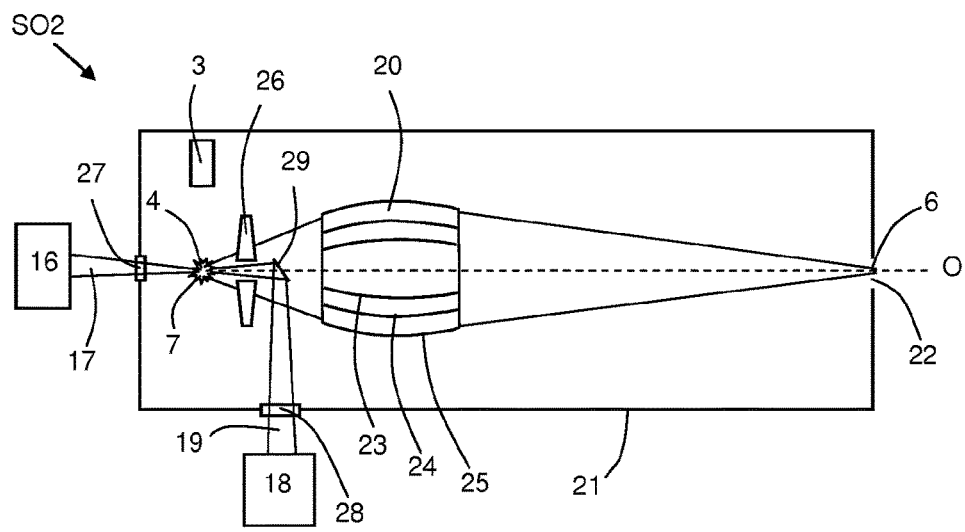
FIG. 3 depicts another radiation source that may supply radiation to the lithographic apparatus of FIG. 1.

FIG. 3 shows a laser produced plasma (LPP) radiation source SO2 which has an alternative configuration to the radiation source shown in FIG. 2. The radiation source SO2 includes a fuel emitter 3 which is configured to deliver fuel to a plasma formation region 4. The fuel may for example be tin, although any suitable fuel may be used. A pre-pulse laser 16 emits a pre-pulse laser beam 17 which is incident upon the fuel. The pre-pulse laser beam 17 acts to preheat the fuel, thereby changing a property of the fuel such as its size and/or shape. A main laser 18 emits a main laser beam 19 which is incident upon the fuel after the pre-pulse laser beam 17. The main laser beam delivers energy to the fuel and thereby coverts the fuel into an EUV radiation emitting plasma 7.

A radiation collector 20, which may be a so-called grazing incidence collector, is configured to collect the EUV radiation and focus the EUV radiation at a point 6 which may be referred to as the intermediate focus. Thus, an image of the radiation emitting plasma 7 is formed at the intermediate focus 6. An enclosure structure 21 of the radiation source SO2 includes an opening 22 which is at or near to the intermediate focus 6. The EUV radiation passes through the opening 22 to an illumination system of a lithographic apparatus (e.g. of the form shown schematically in FIG. 1).

The radiation collector 20 may be a nested collector, with a plurality of grazing incidence reflectors 23, 24 and 25 (e.g. as schematically depicted). The grazing incidence reflectors 23, 24 and 25 may be disposed axially symmetrically around an optical axis O. The illustrated radiation collector 20 is shown merely as an example, and other radiation collectors may be used.

A contamination trap 26 is located between the plasma formation region 4 and the radiation collector 20. The contamination trap 26 may for example be a rotating foil trap, or may be any other suitable form of contamination trap. In some embodiments the contamination trap 26 may be omitted.

An enclosure 21 of the radiation source SO2 includes a window 27 through which the pre-pulse laser beam 17 can pass to the plasma formation region 4, and a window 28 through which the main laser beam 19 can pass to the plasma formation region. A mirror 29 is used to direct the main laser beam 19 through an opening in the contamination trap 26 to the plasma formation region 4.

The radiation sources SO1, SO2 shown in FIGS. 2 and 3 may include components which are not illustrated. For example, a spectral filter may be provided in the radiation source. The spectral filter may be substantially transmissive for EUV radiation but substantially blocking for other wavelengths of radiation such as infrared radiation.

Figure 4:
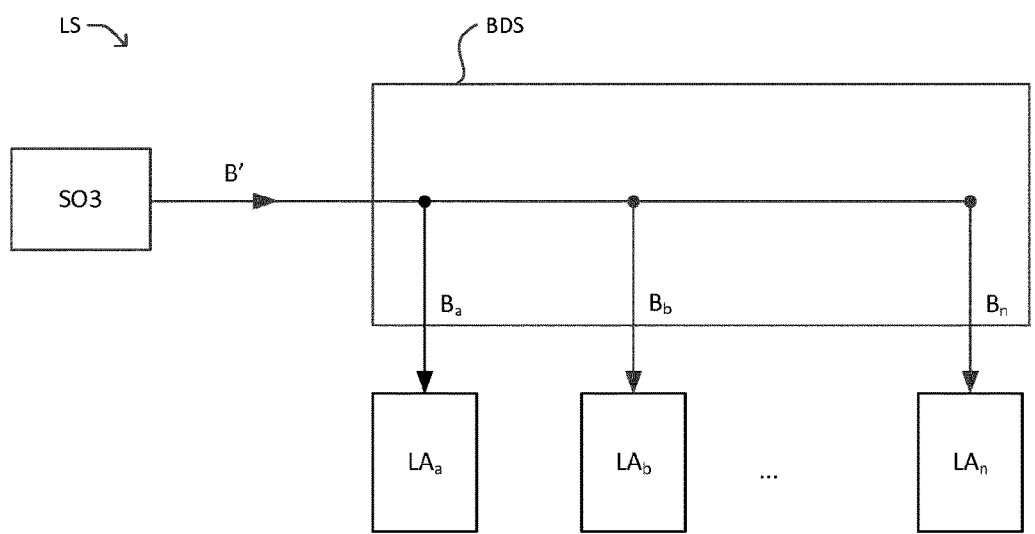
FIG. 4 is a schematic illustration of a lithographic system of which the lithographic apparatus of FIG. 1 may form part.

In an alternative embodiment, the lithographic system may comprise one or more radiation sources that each provide radiation to a plurality of lithographic apparatus LA. FIG. 4 shows such a lithographic system LS according to one embodiment of the invention. The lithographic system LS comprises a radiation source SO3, a beam delivery system BDS and a plurality of lithographic tools $LA_a$-$LA_n$. The radiation source SO3 is configured to generate an extreme ultraviolet (EUV) radiation beam B' (which may be referred to as a main beam) and may, for example, comprise at least one free electron laser.

Each of the lithographic tools $LA_a$-$LA_n$ may be substantially of the form of the lithographic apparatus LA shown in FIG. 1 although it will be appreciated that the tools are not so limited. For example, the tools may comprise lithographic apparatuses, mask inspection apparatuses or Arial Image Measurement Systems (AIMS).

The beam delivery system BDS comprises beam splitting optics. The beam splitting optics splits main radiation beam B' into n separate radiation beams $B_a$-$B_n$ (which may be referred to as branch beams), each of which is directed to a different one of the n lithographic apparatuses $LA_1$-$LA_n$.

The beam delivery system BDS may further comprise beam expanding optics and/or beam shaping optics. The beam expanding optics may be arranged to increase the cross sectional area of the main radiation beam B' and/or the branch radiation beams $B_a$-$B_n$. This decreases the power density of the heat load on mirrors downstream of the beam expanding optics. This may allow the mirrors downstream of the beam expanding optics to be of a lower specification, with less cooling, and therefore less expensive. Further, the lower power density on such mirrors results in less deformation of their optical surfaces due to thermal expansion. Additionally or alternatively, reducing the power density of the heat load on downstream mirrors may allow these mirrors to receive the main radiation beam or the branch radiation beams at a larger grazing incidence angle. For example, the mirrors may receive radiation at a grazing incidence angle of 5 degrees rather than, say, 2 degrees. The beam shaping optics may be arranged to alter the cross sectional shape and/or the intensity profile of the main radiation beam B' and/or the branch radiation beams $B_a$-$B_n$.

In alternative embodiments, the beam delivery system BDS may not comprise beam expanding optics or beam shaping optics.

In some embodiments, the beam delivery system BDS may comprise beam reducing optics, which may be arranged to decrease the cross sectional area of one or more of the main radiation beam B' and/or the branch radiation beams. As discussed above, beam expanding optics may reduce the power density of the heat load received by mirrors within the beam delivery system BDS, which may be desirable. However, beam expanding optics will also increase the size of said mirrors, which may be undesirable. Beam expanding optics and beam reducing optics may be used to reach a desired beam size, which may be the smallest beam cross section that results in optical aberrations below a given threshold level.

Figure 5:
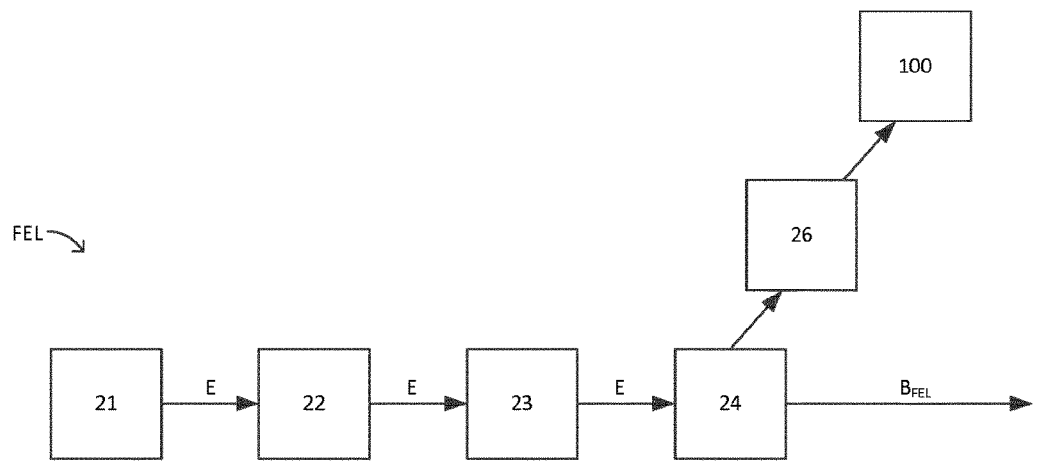
FIG. 5 is a schematic illustration of a free electron laser that may form part of the lithographic system of FIG. 4.

Referring again to FIG. 4, radiation source SO3 is configured to generate an EUV radiation beam B' with sufficient power to supply each of the lithographic apparatus $LA_a$-$LA_n$. As noted above, the radiation source SO3 may comprise a free electron laser. FIG. 5 is a schematic depiction of a free electron laser FEL comprising an injector 21, a linear accelerator 22, a bunch compressor 23, an undulator 24, an electron decelerator 26 and a beam dump 100.

The injector 21 is arranged to produce a bunched electron beam E, which is accelerated to a higher energy by the linear accelerator 22. The injector 21 and the linear accelerator 22 may be considered to form an electron source operable to produce a bunched relativistic electron beam E. Optionally, the electron beam E passes through a bunch compressor 23, disposed between the linear accelerator 22 and the undulator 24. The bunch compressor 23 may be configured to spatially compress existing bunches of electrons in the electron beam E.

The electron beam E then passes through the undulator 24. The undulator 24 comprises a periodic magnet structure, which is operable to produce a periodic magnetic field and is arranged so as to guide the relativistic electron beam E produced by the injector 21 and linear accelerator 22 along a periodic path. As a result, within the undulator 24, the electrons radiate electromagnetic radiation generally in the direction of a central axis of their periodic path.

As the electrons move through the undulator 24, they interact with the electric field of the radiation, exchanging energy with the radiation. In general, the amount of energy exchanged between the electrons and the radiation will oscillate rapidly unless conditions are close to a resonance condition. Under resonance conditions, the electrons bunch together into microbunches, modulated at the wavelength of radiation within the undulator 24, and coherent emission of radiation along the central axis is stimulated.

The path followed by the electron beam within the undulator 24 may be sinusoidal and planar, with the electrons periodically traversing the central axis, or may be helical, with the electrons rotating about the central axis. The type of oscillating path may affect the polarization of radiation emitted by the free electron laser. For example, a free electron laser which causes the electrons to propagate along a helical path may emit circularly polarized radiation and a free electron laser which causes the electrons to propagate along a sinusoidal path may emit linearly polarized radiation.

The radiation produced in the undulator 24 exits the undulator as radiation beam $B_{FEL}$, which may, for example, correspond to the radiation beam B' in FIG. 4.

After leaving the undulator 24, the electron beam E is absorbed by a dump 100. The energy of electrons in the electron beam E may be reduced before they enter the dump 100 by directing the electron beam E through a decelerator 26 disposed between the undulator 24 and the beam dump 100. In an embodiment, the electron beam E which exits the undulator 24 may be decelerated by the linear accelerator 22. That is, the linear accelerator 22 may serve to decelerate the electrons which are output from the undulator 24 and to accelerate the electrons which are output from the injector 21. Such an arrangement is known as an energy recovering linear accelerator (ERL).

Referring again to FIG. 1, the illumination system IL and projection system PS may both be constructed and arranged such that they can be isolated from the external environment. A vacuum may be provided in illumination system IL and/or the projection system PS. A small amount of gas (e.g. hydrogen) at a pressure well below atmospheric pressure may be provided in the illumination system IL and/or the projection system PS.

The radiation beam B passes into the illumination system IL, which is configured to condition the radiation beam. The illumination system IL may include a facetted field mirror device 10 and a facetted pupil mirror device 11. The faceted field mirror device 10 and faceted pupil mirror device 11 together provide the radiation beam B with a desired cross-sectional shape and a desired angular distribution. The radiation beam B passes from the illumination system IL and is incident upon the patterning device MA held by the support structure MT. The patterning device MA reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B enters the projection system PS. The projection system PS comprises a plurality of mirrors 13, 14 which are configured to project the radiation beam B onto a substrate W held by the substrate table WT. The projection system PS may apply a reduction factor to the radiation beam, forming an image with features that are smaller than corresponding features on the patterning device MA. A reduction factor of 4 may for example be applied.

The lithographic apparatus LA may for example be used in a scan mode, in which the support structure MT and the substrate table WT are scanned synchronously while a pattern imparted to the radiation beam B is projected onto a target portion of a substrate W (i.e. a single dynamic exposure). The velocity and direction of the substrate table WT relative to the support structure MT is determined by the demagnification and image reversal characteristics of the projection system PS.

A dose of radiation which is received by a target location of a substrate W depends on the power of the radiation beam to which the target location is exposed (e.g. patterned radiation beam B) and the amount of time for which the target location of the substrate W is exposed to the radiation beam. In an embodiment, the lithographic apparatus LA may be configured to operate in a scan mode such that a target portion of a substrate W is exposed by scanning the substrate W relative to a band of radiation which extends across the target portion transverse to a scanning direction. The band of radiation may be referred to as an exposure slit. The dose of radiation received at a target location on the substrate W depends on an exposure time period during which a radiation beam (e.g. patterned radiation beam B) is directed onto that target location, and the number and duration of pulses which occur in the radiation beam during the exposure time period. For example, in a scanning lithographic apparatus LA, the amount of time for which a target location of the substrate W is exposed to a radiation beam depends on the time taken for that target location to travel through the exposure slit. The dose of radiation which is received at the target location depends upon the number of pulses of the radiation beam which occur during that exposure time period and the average energy which is delivered to the target location with each pulse. In an embodiment, a substrate W may be scanned relative to the exposure slit such that the exposure time period is approximately 1 ms. In other embodiments the exposure time period may be greater than 1 ms and may, for example, be as long as 5 ms (e.g. due to slower scanning movement of the wafer relative to the exposure slit).

Although the projection system PS is depicted in FIG. 1 as having two mirrors 13, 14, it will be appreciated that this is a schematic representation of the projection system PS and that, in practice, the projection system PS may include any number of mirrors. For example, in some embodiments, the projection system PS may comprise more than two mirrors (for example six or more mirrors). Having more than two mirrors is advantageous because it increases the extent to which the projection system PS can be adjusted, for example to reduce optical aberrations. Thus, a projection system with more than two mirrors (for example six or more mirrors) may allow a better quality image to be formed on the substrate W than an arrangement with two mirrors.

Figure 6:
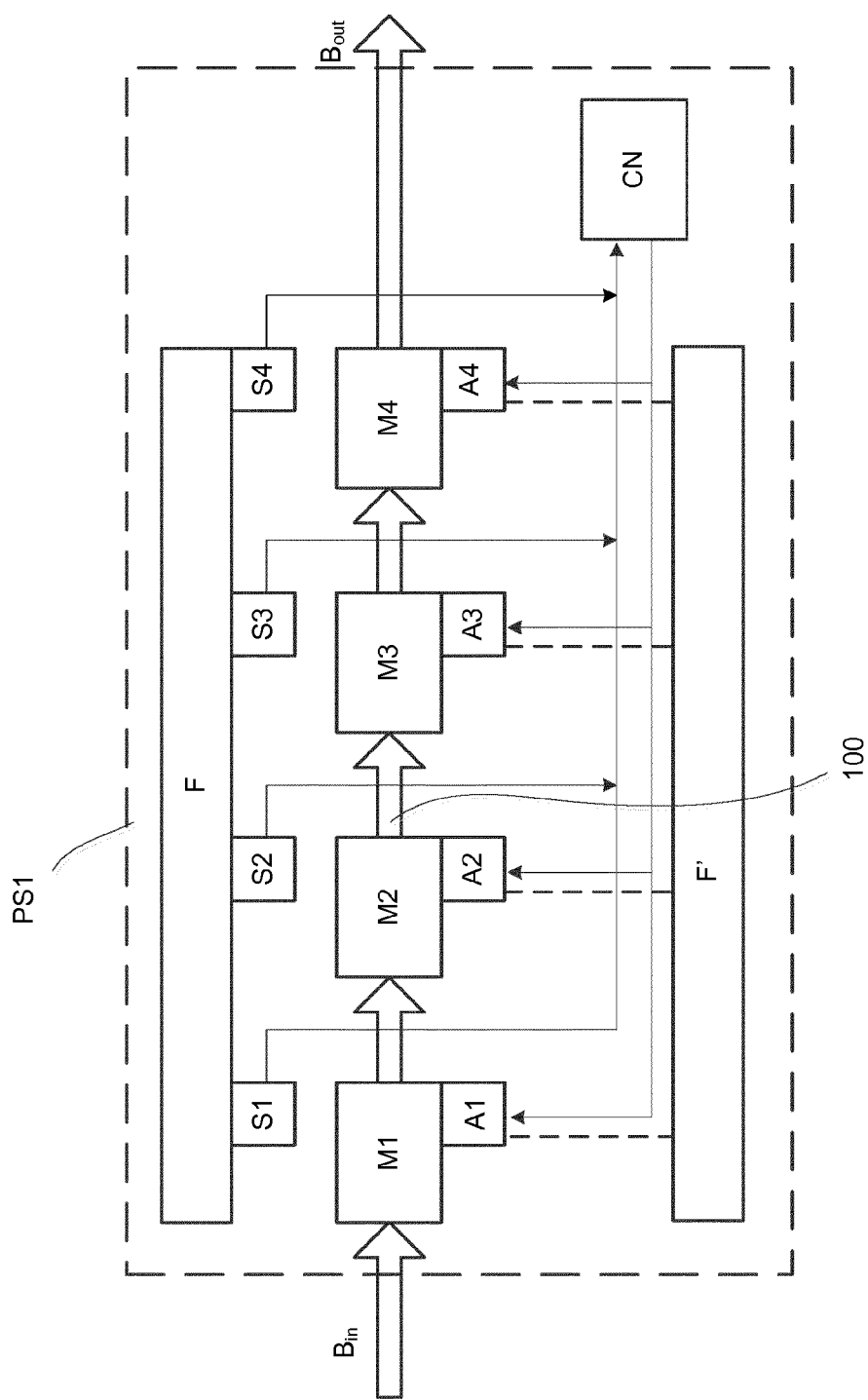
FIG. 6 is a schematic illustration of a projection system according to an embodiment of the present invention that may form part of the lithographic apparatus of FIG. 1.

FIG. 6 shows a projection system PS1 according to one embodiment of the invention, which may form the projection system PS of FIG. 1. Projection system PS1 comprises an optical path 100 that is operable to receive an input radiation beam $B_{in}$ (which corresponds to patterned radiation beam B from the patterning device MA) and to project an output radiation beam $B_{out}$ onto a substrate W held by the substrate table WT (not shown in FIG. 6). The optical path 100 comprises four mirrors M1, M2, M3, M4. It will be appreciated that optical path 100 may further comprise additional mirrors (not shown). FIG. 6 is a schematic representation of projection system PS1 and optical path 100 has been represented linearly. However, it will be appreciated that the direction of radiation along the optical path 100 (the optical axis) will change at each mirror M1, M2, M3, M4.

In general, any movement of any of the mirrors M1, M2, M3, M4 of the projection system PS1 relative to the mask support structure MT and/or the substrate table WT will affect the image projected onto the substrate W. A global movement of the mirrors M1, M2, M3, M4 which form the optical path 100 may result in a line-of-sight error, causing the image on the substrate W to be translated relative to the substrate W. If uncorrected, this can result in an alignment/overlay error, i.e. the image may be shifted relative to patterns that have previously been formed on the substrate W. Further, any movement of any of the mirrors M1, M2, M3, M4 relative to the other mirrors M1, M2, M3, M4 can cause a distortion of the image that is formed on the substrate W. In particular, movement of any of the mirrors M1, M2, M3, M4 relative to the other mirrors M1, M2, M3, M4 may cause a distortion of the wavefront (i.e. a line of constant phase) of the radiation beam after it passes through the projection system PS1. This may be referred to as an optical aberration. Optimal imaging on the substrate W may be achieved when each of the mirrors M1, M2, M3, M4 is in a desired position, which may be referred to as a nominal position. That is, when each of the mirrors M1, M2, M3, M4 is disposed in its nominal position, the image projected onto the substrate W may be a desired image. When one or more of the mirrors M1, M2, M3, M4 is displaced from its nominal position, the image projected onto the substrate W may be distorted and/or shifted. That is, any deviations of any of the mirrors M1, M2, M3, M4 from their nominal positions may result in line-of-sight errors and/or optical aberrations.

The projection system PS1 further comprises a sensor frame F. The position of each of the mirrors M1, M2, M3, M4 relative to the sensor frame F is actively controlled, as now described. That is, sensor frame F serves as a position reference for each of the mirrors M1, M2, M3, M4. It will be appreciated that for any three dimensional object the term "position" may refer to the location of the object (for example the location of its centre of mass) and/or the orientation of the object. Therefore, the position of each mirror may be characterized using six degrees of freedom (three for its location and three for its orientation).

The projection system PS1 further comprises a plurality of sensors S1, S2, S3, S4. Each sensor S1, S2, S3, S4 is associated with one of the mirrors M1, M2, M3, M4 respectively and is operable to determine and output a signal indicative of a position of that optical element relative to the sensor frame F. Each sensor may comprise one or more linear encoders, each linear encoder comprising an encoder head that is arranged to read a scale, said scale being indicative of a position. The encoder heads may be disposed on the sensor frame F and the scales may be provided on a body of each of the mirrors M1, M2, M3, M4. Each sensor S1, S2, S3, S4 is operable to sample (and output a signal indicative of) the position of its associated mirror M1, M2, M3, M4 relative to the sensor frame F at a sample rate. The sample rate of each sensor S1, S2, S3, S4 may be dependent on the type of encoder heads used. Each sensor S1, S2, S3, S4 may use the same type of sensor head and may be operable to sample the position of its associated mirror M1, M2, M3, M4 relative to the sensor frame F at substantially the same sample rate. The sample rate may be sufficiently high that the position of each mirror M1, M2, M3, M4 relative to the sensor frame F is sampled several times during an exposure time period of the lithographic apparatus LA (i.e. the time during which a given location on a substrate received patterned radiation). This may be referred to as sampling in real time. In some embodiments, the sample rate of each sensor S1, S2, S3, S4 may be at least a factor or ten greater than an exposure rate (defined as the inverse of the exposure time period) of the lithographic apparatus LA. In some embodiments the exposure time period may be of the order of 1 ms (equivalent to an exposure rate of 1 kHz) and the sample rate of each sensor S1, S2, S3, S4 may be of the order of tens of kHz, for example between 10-20 kHz. The sampling frequency of each sensor S1, S2, S3, S4 may be at least twice the highest resonant (eigen) frequency of its associated mirror M1, M2, M3, M4. This avoids any aliasing effects of the sampling.

Any deformations of the sensor frame F will lead to position errors of the mirrors M1, M2, M3, M4, which in turn will result in line-of-sight errors and/or optical aberrations. Although some deformations of the sensor frame F will occur, the sensor frame F may be sufficiently thermally and mechanically stable to keep such errors below an acceptable tolerance level.

The projection system PS1 further comprises a plurality of actuators A1, A2, A3, A4. Each actuator A1, A2, A3, A4 is associated with one of the mirrors M1, M2, M3, M4 respectively and is operable to alter the position of that mirror M1, M2, M3, M4.

The projection system PS1 further comprises a mirror support frame F'. Each of the mirrors M1, M2, M3, M4 is connected to the mirror support frame F' via its associated actuator A1, A2, A3, A4. Alternatively, in other embodiments, each of the mirrors M1, M2, M3, M4 may be connected to the sensor frame F via its associated actuator A1, A2, A3, A4.

Each actuator A1, A2, A3, A4 is operable to alter the position of its corresponding mirror M1, M2, M3, M4 relative to the sensor frame F with a control bandwidth. The control bandwidth of each mirror M1, M2, M3, M4 may be defined as the frequency below which that mirror M1, M2, M3, M4 accurately tracks the sensor frame F. For example, the actuators A1, A2, A3, A4 may be arranged such that when the sensor frame F moves, their corresponding mirrors will move in a similar way so as to compensate for the motion of the sensor frame F and maintain the position of the mirrors M1, M2, M3, M4 relative to the sensor frame F. Each mirror M1, M2, M3, M4 cannot compensate for any movement of the sensor frame F which has a frequency above its control bandwidth. Generally, each mirror M1, M2, M3, M4 can compensate for any movement of the sensor frame F which has a frequency below its control bandwidth. Further, the greater the difference between the control bandwidth of the mirror M1, M2, M3, M4 and the frequency of the motion of the sensor frame F, the more accurately the mirror can compensate for that motion. For example, two mirrors with respective bandwidths of 50 Hz and 200 Hz will both be able to compensate for motion of the sensor frame which has a frequency in the range of 5-20 Hz. However, the mirror with the bandwidth of 200 Hz will compensate for the motion with greater accuracy. If a first mirror has a bandwidth that is a factor of a greater than a second mirror then the tracking accuracy of the first mirror may be a factor of around $\alpha^4$ greater than the second mirror (for motion of the sensor frame F well below both control bandwidths). Note that the transition from the behavior above and below the control bandwidth of each mirror is not discontinuous. Rather, there is a frequency range around the control bandwidth of each mirror M1, M2, M3, M4 wherein movement of the sensor frame F relative to that mirror M1, M2, M3, M4 is amplified.

The control bandwidth required to maintain line-of-sight errors and/or optical aberrations below a specified level may be dependent upon the amount of movement of the sensor frame F and its frequency spectrum. For embodiments wherein lithographic apparatus LA is used in a scan mode, the frequency spectrum may be dependent upon the frequency of the scanning motion of the support structure MT and the substrate table WT. In some embodiments, this scanning motion may have a frequency in the range 5-20 Hz.

The control bandwidth of each mirror M1, M2, M3, M4 may depend on the type of actuator A1, A2, A3, A4 used. Further, the maximum bandwidth that each actuator A1, A2, A3, A4 can provide is limited by the resonant frequencies of its associated mirror M1, M2, M3, M4. The resonant frequencies of each mirror M1, M2, M3, M4 are dependent upon the mechanical design the mirror M1, M2, M3, M4 (i.e. its size and shape) and the material from which it is formed. For example, relatively thin mirrors have relatively low resonant frequencies and therefore have low control bandwidths. Further, relatively large mirrors tend to be relatively flat and therefore tend to have lower resonant frequencies and hence a lower control bandwidth.

In some embodiments, the plurality of mirrors M1, M2, M3, M4 which form the optical path 100 have a range of different control bandwidths. In particular, at least two of the mirrors M1, M2, M3, M4 may have significantly lower control bandwidths than the other mirrors. In one embodiment, a first set of the mirrors M1, M4 have relatively low control bandwidths and a second set of the mirrors M2, M3 have relatively high control bandwidths. For example, the first set of mirrors M1, M4 may be larger and thinner than the second set of mirrors M2, M3. Mirrors M1, M4 may have, for example, a control bandwidth of the order of <100 Hz, for example of the order of 50 Hz. Mirrors M2, M3 may have, for example, a control bandwidth of the order of <1 kHz, for example of the order of 200 Hz. Note that for embodiments wherein mirrors have a control bandwidth of around 50 Hz and mirrors M2, M3 have a control bandwidth of around 200 Hz the tracking accuracy of mirrors M2, M3 may be of the order of $4^4$=256 greater than that of mirrors M1, M4.

In general, the first set of mirrors M1, M4 may for example have a control bandwidth which is at least a factor of two lower than the second set of mirrors M2, M3. The first set of mirrors M1, M4 may for example have a control bandwidth which is around a factor of four or more lower than the second set of mirrors M2, M3.

Each actuator A1, A2, A3, A4 may comprise one or more linear motors. Each linear motor may for example control motion of the mirror M1, M2, M3, M4 associated with that actuator A1, A2, A3, A4 in a different direction. Each linear motor may be a Lorentz-type actuator, comprising a stator and a mover. The stator may be disposed on the mirror support frame F' which supports the mirror M1, M2, M3, M4 and the mover may be connected directly to a body of the mirror M1, M2, M3, M4. The mover may comprise a magnet yoke formed by one or more permanent magnets and the mover may comprise one or more coils of conducting wire. When an electric current is provided through the one or more coils, a magnetic field is generated around the coils, which interacts with the magnetic field produced by the permanent magnets such that the stator exerts a force on the mover.

The projection system PS1 further comprises a controller CN. The controller CN is operable to receive a signal from each each sensor S1, S2, S3, S4 that is indicative of the position of its corresponding mirror M1, M2, M3, M4 relative to the sensor frame F. The controller CN is further operable, in response to the signals from each each sensor, to generate and output a signal to each actuator A1, A2, A3, A4. The signals generated and output by the controller CN may be generated using a model. The signals may be such that the actuators A1, A2, A3, A4 move their respective mirrors M1, M2, M3, M4 so as to reduce deviations in the positions of mirrors M1, M2, M3, M4 from their nominal positions. Therefore, the signals may be such that the actuators A1, A2, A3, A4 move their respective mirrors M1, M2, M3, M4 so as to reduce line-of-sight errors and optical aberrations.

The signals may be such that the actuators A1, A2, A3, A4 move their respective mirrors M1, M2, M3, M4 so as to reduce any line-of-sight errors below a specified alignment threshold level. That is, the actuators A1, A2, A3, A4 may move their respective mirrors M1, M2, M3, M4 so as to reduce any global movement of the mirrors M1, M2, M3, M4 from their nominal positions. The specified alignment threshold level may be dependent upon the critical dimension of the lithographic apparatus LA. In some embodiments, the specified threshold level may be less than 1 nm, for example 0.25 nm or 0.1 nm.

Similarly, the signals may be such that the actuators A1, A2, A3, A4 move their respective mirrors M1, M2, M3, M4 so as to reduce the level of optical aberrations below a specified aberration threshold level. That is, the actuators A1, A2, A3, A4 may move their respective mirrors M1, M2, M3, M4 so as to reduce any movement of any of the mirrors M1, M2, M3, M4 relative to the other mirrors M1, M2, M3, M4. An optical aberration may be defined as a distortion of the wavefront (i.e. a line of constant phase) of the radiation beam after it passes through the projection system PS1. Therefore an optical aberration may be considered to introduce a modulation to the shape of the wavefront of the output radiation beam $B_{out}$. The size of an optical aberration may be considered to be the size of this modulation, which may be expressed as a fraction of the wavelength of the radiation. In some embodiments, the specified aberration threshold level for optical aberrations may be around 0.02 nm for EUV radiation, which may be around one tenth of an overall optical aberration specification for the lithographic apparatus.

The specified alignment and aberration threshold levels set the accuracy with which the mirrors M1, M2, M3, M4 should be controlled. The smaller the specified threshold levels, the higher the accuracy with which the mirrors M1, M2, M3, M4 should be controlled.

As described above, in embodiments of the invention a set of at least two of the mirrors M1, M4 have limited control bandwidth. However, the sensors S1, S4 are operable to accurately monitor the positions of these mirrors M1, M4 in real time. Any deviation in the position of either of these two mirrors M1, M4 from its nominal position will in general cause line-of-sight errors and/or optical aberrations.

The controller CN is operable to determine an optical aberration caused by any such deviation in the positions of mirrors M1, M4 from their nominal positions. The other mirrors M2, M3 may be assumed to be in their nominal positions for the purposes of determining the optical aberration caused by deviations in the positions of mirrors M1, M4 from their nominal positions. The optical aberration can be determined from the positions of each of the mirrors M1, M4 as determined by the sensors S1, S4. That is, there are twelve input values (six degrees of freedom for the position of each of the two mirrors M1, M4) which define the optical aberration. However, these twelve input values may not be independent and some of the input values may be correlated. Some of the input values may have a greater effect on the determined optical aberration than others, depending on the shapes of the mirrors M1, M4.

The controller CN is further operable to determine an adjustment for each of the other mirrors M2, M3 that would at least partially compensate for the determined optical aberration. The determined adjustment is a determined position for each of the mirrors M2, M3. That is, controller CN is operable to determine positions for each of the other mirrors M2, M3 (deviations from their nominal positions) that reduce the level of optical aberrations in the image formed on the substrate W. The positions for each of the other mirrors M2, M3 are determined by the controller CN using a model. The correction of the optical aberration achieved in this way may not be perfect but it may reduce the optical aberration and may bring the image within a specified tolerance level. The controller CN is further operable to output a signal to each of the actuators A2, A3 associated with the other mirrors M2, M3 so as to cause each of said mirrors M2, M3 to move to said determined positions.

The controller CN may also be operable to send a signal to an actuator (not shown) of the substrate table WT. The signal may cause the substrate table WT to move so as to at least partially correct for any line-of-sight errors caused by the positions of mirrors M1, M4. Additionally or alternatively, the controller CN may also be operable to send a signal to an actuator (not shown) of the mask support structure MT. The signal may cause the mask support structure MT to move so as to at least partially correct for any line-of-sight errors caused by the positions of mirrors M1, M4.

Because the position of each mirror M1, M2, M3, M4 can be accurately measured at a high sampling rate, the combined line-of-sight error and optical aberrations caused by mirrors M1, M4 can be determined in real time. This information can then be used to drive the high-bandwidth mirrors M2, M3 to correct for the line-of-sight error and/or optical aberrations.

Therefore, in spite of the presence of at least two mirrors M1, M4 with relatively low control bandwidths, the projection system PS1 is operable to correct for optical aberrations and line-of-sight errors caused by these two mirrors M1, M4 in real time. Such an arrangement may be used to achieve an improved line-of-sight accuracy than would be possible by using a standard active feed-back loop due to the low control bandwidth of mirrors M1, M4.

As described above, it will be appreciated that optical path 100 may comprise more than four mirrors M1, M2, M3, M4. For example, in some embodiments, the projection system PS1 may comprise six or more mirrors. For such embodiments, the optical system 100 may comprise two or more mirrors with relatively low control bandwidths and the remaining mirrors may have relatively high control bandwidths. Further, the optical path 100 may comprise three mirrors: two mirrors with relatively low control bandwidths and one mirror with a relatively high control bandwidth. It will be appreciated that some embodiments may have other numbers of mirrors.

The controller CN may be operable to implement a model so as to determine the optical aberration caused by the positions of mirrors M1, M4. The model may contain information relating to the shape and nominal position of each mirror M1, M2, M3, M4. The controller CN may be operable to calculate the optical aberration and the desired positions of mirrors M2, M3 directly using a suitable algorithm (for example using matrix inversion techniques). Alternatively, the controller CN may be operable to use one or more look up tables or similar to determine the optical aberration and the desired positions of mirrors M2, M3. There may be more than one set of positions of mirrors M2, M3 which would result in a reduction in the optical aberration caused by the positions of mirrors M1, M4. If so, the controller CN may, for example, select the set of positions of mirrors M2, M3 which results in the greatest reduction in the optical aberration caused by the positions of mirrors M1, M4.

The model used by the controller CN may be linear within a range of positions of mirrors M1, M2, M3, M4. Periodically, for example between exposures of two substrates W, the lithographic apparatus LA may be operable to measure the wavefront of patterned radiation beam B at the substrate level so as to determine the optical aberration directly. This may be compared to an aberration determined by the controller CN using the model. This direct measurement may be used to periodically calibrate the model used by the controller. Similarly, the lithographic apparatus LA may be operable to periodically (for example between exposures of two substrates W) measure the position and orientation of an image formed in the plane of the substrate W by the projection system PS1. The measurements of the position and/or orientation of the image may be used to periodically calibrate the model used by the controller.

The measurements of the optical aberration and the position and orientation of the image may be made using a sensor and a shearing interferometer, as now described.

A sensor S may be provided on the substrate table WT of the lithographic apparatus (see FIG. 1). The sensor S is configured to measure aberrations in the radiation beam projected by the projection system PS. The sensor S may for example comprise an imaging array (e.g. a CCD array). A diffraction grating (not shown) is provided either on the patterning device MA or on the support structure MT. In order to perform a measurement of the aberrations caused by the projection system PS, the support structure MT is moved such that the radiation beam B illuminates the diffraction grating. The projection system PS forms an image of the diffraction grating at the substrate table WT. The sensor S is positioned beneath the projection system PS to capture the image of the diffraction grating. A series of diffraction grating images are captured at different positions relative to the focal plane (i.e. different positions in a direction perpendicular to the plane of the substrate table WT). The images are analysed to provide measurements of the aberrations which have been introduced into the radiation beam B by the projection system PS. The wavefront may be expressed as a linear combination of Zernike polynomials with appropriate Zernike coefficients, as is known in the art. Therefore, the aberrations may for example be expressed as a set of Zernike coefficients. A set of measurements may be performed with the diffraction grating and sensor S at different positions along the exposure slit. Alternatively, the sensor S may comprise an imaging array (e.g. CCD array) which is sufficiently large to capture an image along the entire extent of the exposure slit (in the non-scanning direction). Where this is the case the diffraction grating may similarly extend fully along the exposure slit. Aberration measurements are thus determined along the exposure slit, thereby providing a characterization of the aberrations introduced by the projection system PS over the entire area of the exposure slit.

Figure 7:
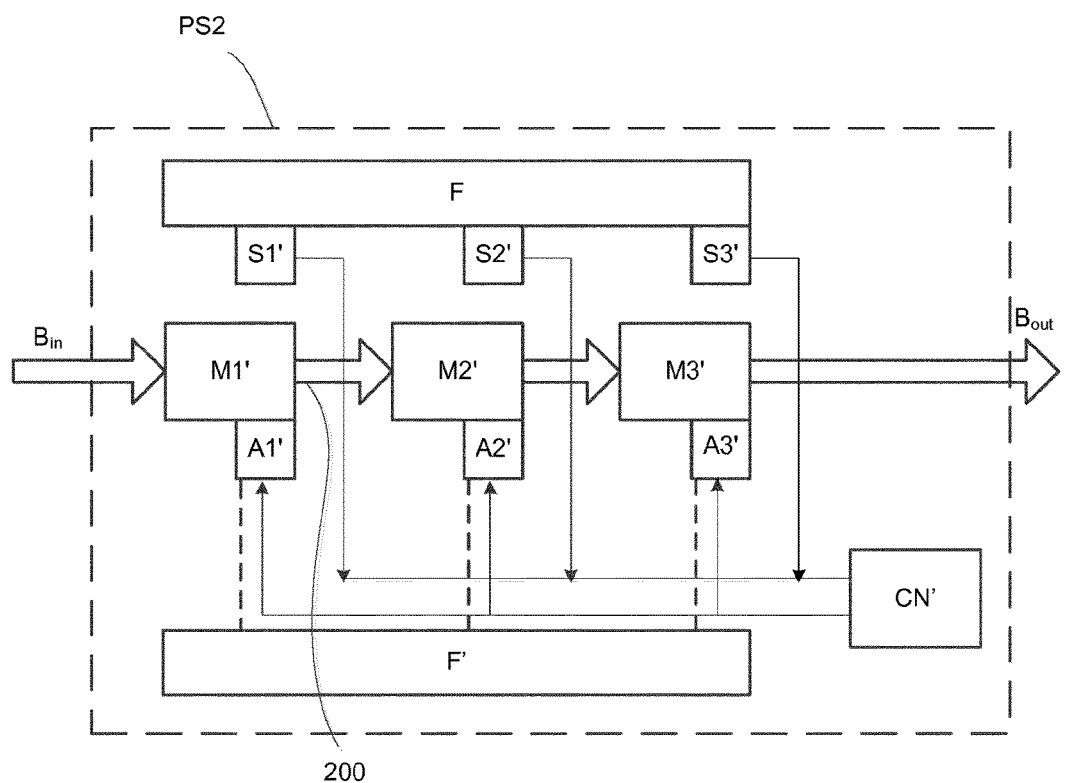
FIG. 7 is a schematic illustration of another projection system according to an embodiment of the present invention that may form part of the lithographic apparatus of FIG. 1.

FIG. 7 shows an alternative projection system PS2 according to another embodiment of the invention, which may form the projection system PS of FIG. 1. Projection system PS2 comprises an optical path 200 that is operable to receive an input radiation beam $B_{in}$ (which corresponds to patterned radiation beam B from the patterning device MA) and to project an output radiation beam $B_{out}$ onto a substrate W held by the substrate table WT. Projection system PS2 is generally similar to projections system PS1 and the following description will concentrate on the differences between the two projection systems PS1, PS2.

Optical path 200 comprises three mirrors M1', M2', M3' although it will be appreciated that optical path 200 may further comprise additional mirrors (not shown). As with projection system PS1, projection system PS2 further comprises: a plurality of sensors S1', S2', S3'; a plurality of actuators A1', A2', A3'; and a controller CN'. Each sensor S1', S2', S3' is associated with one of the mirrors M1', M2', M3' respectively and is operable to determine and output a signal indicative of a position of that optical element relative to the sensor frame F. Each actuator A1', A2', A3' is associated with one of the mirrors M1', M2', M3' respectively and is operable to alter the position of that mirror M1', M2', M3', for example relative to the sensor frame F. The sensors S1', S2', S3' and actuators A1', A2', A3' may be substantially the same as those described above in connection with projection system PS1.

The projection system PS2 comprises a mirror support frame F' and each of the mirrors M1', M2', M3' is connected to the mirror support frame via its associated actuator A1', A2', A3'. Alternatively, in other embodiments each of the mirrors M1', M2', M3' may be connected to the sensor frame F via its associated actuator A1', A2', A3'.

As with projection system PS1, at least two of the mirrors M1', M2', M3' may have significantly lower control bandwidths than the other mirror. In this embodiment, a first set of the mirrors M1', M2', M3' have relatively low control bandwidths and a second set of the mirrors M1', M2', M3' have relatively high control bandwidths. The first set comprises two of the mirrors M1', M3' and the second set comprises one of the mirrors M2'.

The controller CN' is operable to receive the signal from each sensor S1', S2', S3' that is indicative of the position of its corresponding mirror M1', M2', M3' relative to the sensor frame F. The controller CN' is further operable, in response to the signals from each each sensor, to generate and output a signal to each actuator A1', A2', A3'. The signals may be such that the actuators A1', A2', A3' move their respective mirrors M1', M2', M3' so as to reduce deviations in the positions of mirrors M1', M2', M3' from their nominal positions. Therefore, the signals are such that the actuators A1', A2', A3' move their respective mirrors M1', M2', M3' so as to reduce line-of-sight errors and optical aberrations. The signals may be such that the actuators A1', A2', A3' move their respective mirrors M1', M2', M3' so as to reduce any line-of-sight errors below a specified alignment threshold level. Similarly, the signals may be such that the actuators A1', A2', A3' move their respective mirrors M1', M2', M3' so as to reduce the level of optical aberrations below a specified aberration threshold level.

The specified alignment and aberration threshold levels set the accuracy with which the mirrors M1', M2', M3' should be controlled. The smaller the specified threshold levels, the higher the accuracy with which the mirrors M1', M2', M3' should be controlled.

As described above, a set of two of the mirrors M1', M3' have limited control bandwidth. However, the sensors S1', S3' are operable to accurately monitor the positions of these mirrors M1', M3' in real time. Any deviation in the position of either of these two mirrors M1', M3' from its nominal position will in general cause line-of-sight errors and/or optical aberrations.

In a similar way to controller CN of projection system PS1, controller CN' is operable to determine an optical aberration caused by any such deviation in the positions of mirrors M1', M3' from their nominal positions.

Optical path 200 comprises adaptive optics, with mirror M2' being an adjustable optical element. In particular, mirror M2' is a deformable mirror. Mirror M2' may for example be referred to as a multi-Zernike mirror. Actuator A2' is further operable to control the shape of a reflective surface of mirror M2'. Controller CN' is operable to determine an adjustment for mirror M2' that would at least partially compensate for the determined optical aberration. The determined adjustment for mirror M2' is a determined shape and/or position of mirror M2'. That is, controller CN' is operable to determine a shape and/or position of mirror M2' that reduces the level of optical aberrations in the image formed on the substrate W. The correction of the optical aberration achieved in this way may not be perfect but it may reduce the optical aberration and may bring the image within a specified tolerance level. The controller CN' is further operable to output a signal to the actuator A2' associated with the mirror M2' so as to cause the mirror M2' to deform/move to said determined shape/position.

Further, similarly to controller CN of projection system PS1, controller CN' may be operable to send a signal to an actuator (not shown) of the substrate table WT and/or send a signal to an actuator (not shown) of the support structure MT. The signals may cause the substrate table WT and/or support structure MT to move so as to at least partially correct for any line-of-sight errors caused by the positions of mirrors M1', M3'.

Therefore, in spite of the presence of at least two mirrors M1', M3' with relatively low control bandwidths, the projection system PS2 is operable to correct for optical aberrations caused by these two mirrors M1', M3' in real time. Such an arrangement may be used to achieve an improved line-of-sight accuracy, and a reduced level of optical aberrations, than would be possible by using a standard active feed-back loop due to the low control bandwidth of mirrors M1', M3'.

As described above, it will be appreciated that optical path 200 may comprise more than three mirrors M1', M2', M3'. For example, in some embodiments, the projection system PS2 may comprise six mirrors. For such embodiments, the optical system 200 may comprise two mirrors with relatively low control bandwidths and four mirrors with relatively high control bandwidths.

Each of the projection system PS1 of FIG. 6 and the projection system PS2 of FIG. 7, is operable to at least partially compensate for optical aberrations caused by the positions of two or more mirrors with relatively low control bandwidths. In the projection system PS1 of FIG. 6, the positions of two or more mirrors M2, M3 are used to achieve this correction. In the projection system PS2 of FIG. 7, the shape of a deformable mirror M2 is used to achieve this correction. In an alternative embodiment, the projection system PS may use a combination of movable mirrors and deformable mirrors to at least partially compensate for optical aberrations caused by the positions of two or more mirrors with relatively low control bandwidths.

The optical elements that are used to at least partially compensate for optical aberrations caused by the positions of two or more mirrors with relatively low control bandwidths may be referred to as an active wavefront compensator.

Figure 8:
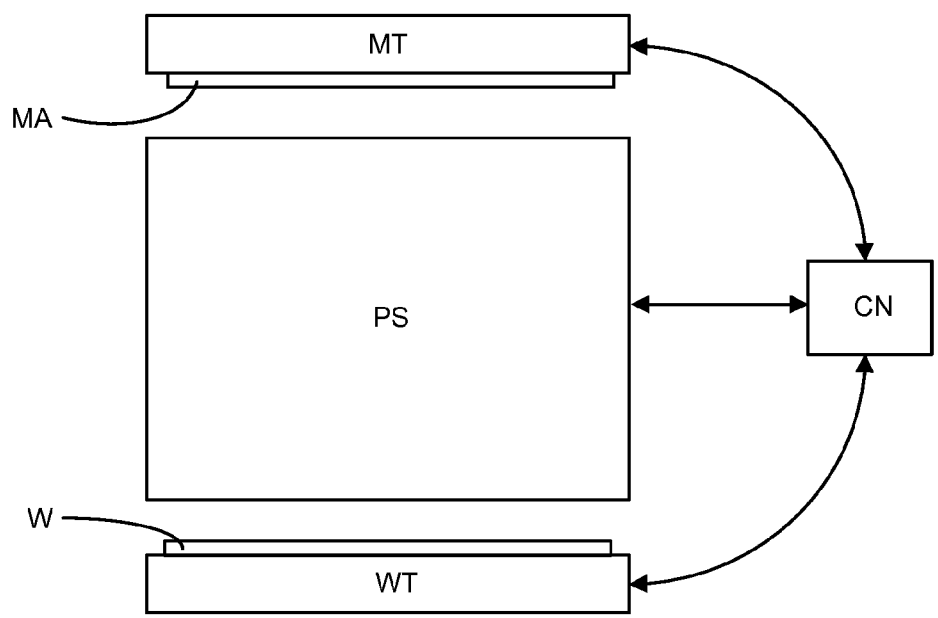
FIG. 8 is a schematic illustration of part of a lithographic apparatus, according to an embodiment.

FIG. 8 schematically depicts part of a lithographic apparatus according to an embodiment of the invention. A support structure MT configured to support a patterning device MA (e.g. a mask), a projection system PS, and a substrate table WT configured to support a substrate W are depicted. The support structure MT and substrate table WT may include features described above in connection with FIG. 1, and may form part of a lithographic apparatus which generally corresponds with a lithographic apparatus as described above. The projection system PS may for example generally correspond with the projection system (PS1) described above in connection with FIG. 6, or may generally correspond with the projection system (PS2) described above in connection with FIG. 7. FIG. 8 also depicts a controller CN. The controller CN may include features described above in connection with other embodiments.

As is schematically indicated by arrows, the controller CN receives signals regarding the positions of mirrors in the projection system PS, and also sends signals which control the positions of mirrors in the projection system. The controller CN may receive signals regarding the shape of one or more mirrors of the projection system, and the controller may send signals which control the shape of one or more mirrors of the projection system. In addition, the controller CN receives signals regarding the position of the substrate table WT, and transmits signals which control the position of the substrate table. Finally, the controller CN receives signals which indicate the position of the patterning device support structure MT, and transmits signals which control the position of the patterning device support structure.

The controller CN may for example be configured to use the method described above in connection with FIG. 6 to control the positions of mirrors of the projection system. The controller CN may in addition be configured to control the position of the patterning device support structure MT to reduce a residual line-of-sight error of the radiation beam being projected by the projection system and/or to reduce residual optical aberrations of the radiation beam. In this context, the term "residual" is intended to refer to an error which remains after the positions of the mirrors have been adjusted using the method described further above in connection with FIG. 6.

The controller CN may use a model to calculate the residual error based upon the positions of the mirrors, after corrections have been applied to the mirror positions. The calculated adjustment applied to the position of the patterning device support structure MT is arranged to reduce this calculated residual error.

Thus, the controller CN does not simply try to separately minimize a position error associated with each mirror of the projection system PS individually and to minimise a position error of the patterning device support structure MT (i.e. try to keep each of these as close as possible to their nominal positions). Instead, the controller CN uses a model which models the effect of position errors of the mirrors and the effect of position errors of the patterning device support structure MT. The controller uses the model to determine corrections of the positions of the mirrors which will reduce a line-of-sight error and/or reduce aberrations of the radiation beam. The controller then determines a position of the patterning device support structure MT which will reduce a residual error of the line-of-sight of the radiation beam projected onto the substrate W (and/or reduce the aberration of the radiation beam).

In an embodiment, the position of the substrate table WT may be controlled in an equivalent manner. That is, the controller CN may calculate a residual error which remains after the positions of the mirrors have been corrected using the method described above in connection with FIG. 6. The position of the substrate table WT may then be adjusted by the controller to reduce that residual error.

In an embodiment, the controller CN may calculate an adjustment to be applied to the position of the patterning device support structure MT, and the controller may additionally control the position of the substrate table WT to follow the position of the patterning device support structure. In other words, the controller CN moves the substrate table in synchronization with the patterning device support structure MT (taking into account a reduction factor of the projection system and the fact that the patterning device support structure MT and substrate table WT may have scanning movements in opposite directions). Thus, the controller CN calculates a position adjustment of the patterning device support structure MT based upon the calculated residual error following mirror adjustment, but does not need to also calculate a position adjustment of the substrate table WT based upon the calculated residual error following mirror adjustment. Instead, the first calculation is sufficient, i.e. the calculation for the patterning device support structure. The position of the substrate table is simply synchronized with the position of the patterning device support structure. The synchronization, which may be referred to as feedthrough control of the substrate table from the patterning device support structure, may be controlled by the controller CN.

In general, the controller CN may control the position of both the patterning device support structure MT and the substrate table WT to reduce the residual error remaining once the positions of the mirrors have been corrected according to the embodiment described above in connection with FIG. 6.

In a further embodiment, the controller CN may control the position of the patterning device support structure MT and/or the substrate table WT to reduce the residual error which remains after the shape and/or position of a mirror or mirrors of the projection system PS have been corrected (e.g. using the method described above in connection with FIG. 7).

In the above embodiments, a residual error which remains after correction of mirror positions and/or shapes is calculated by the controller CN. The controller CN then reduces the residual error by controlling the position of the patterning device support structure MT and/or the substrate table WT. In a modified approach, a combined error, which is a combination of the error caused by mirror positions and/or shapes, and the error caused by the patterning device support structure position, is determined. The controller then controls the positions and/or shapes of the mirrors in combination with a position of the patterning device support structure MT to minimise this error. In this embodiment the substrate table WT may be synchronized with the patterning device support structure MT.

An equivalent approach may be used with a combined error caused by the positions and/or shapes of the mirrors and the position of the substrate table WT. The controller determines a combined error, which is a combination of the error caused by mirror positions and/or shapes, and the error caused by the substrate table position. The controller then controls the positions and/or shapes of the mirrors in combination with a position of the substrate table WT to minimise this error. In this embodiment the patterning device support structure MT may be synchronized with the substrate table WT.

In a further embodiment, the combined error caused by the positions and/or shapes of the mirrors, the position of the patterning device support structure, and the position of the substrate table WT is determined. The controller then controls the positions and/or shapes of the mirrors in combination with a position of the patterning device support structure MT and a position of the substrate table WT to minimise this error.

In an embodiment, feedback may be provided in a multi-directional manner to and from the controller CN. Thus, for example, as described above a residual error after the positions and/or shapes of the mirrors of the projection system PS have been adjusted may be used as an input when determining the position of the patterning device support structure MT. In addition, however, an error in the adjusted position of the patterning device support structure MT may be used by the controller CN to calculate an adjustment to be applied to the positions and/or shapes of the mirrors of the projection system. This is multi-directional feedback.

In a further example of multi-directional feedback, a residual error after the positions and/or shapes of the mirrors of the projection system PS have been adjusted may be used as an input when determining the position of the substrate table WT (as described above). In addition, an error in the adjusted position of the substrate table WT may be used by the controller CN to calculate an adjustment to be applied to the positions and/or shapes of the mirrors of the projection system.

In a further example of multi-directional feedback, a residual error after the positions and/or shapes of the mirrors of the projection system PS have been adjusted may be used as an input when determining the position of the patterning device support structure MT and substrate table WT (as described above). Errors in the adjusted positions of the patterning device support structure MT and the substrate table WT may be used by the controller CN to calculate an adjustment to be applied to the positions and/or shapes of the mirrors of the projection system.

In another example of multi-directional feedback, a residual error after the positions and/or shapes of the mirrors of the projection system PS have been adjusted may be fed back and used as an input for the controller, which may then calculate a further adjustment of the positions and/or shapes of the mirrors of the projection system. In this example, the multi-directional feedback is applied only in relation to the mirrors of the projection system.

In an embodiment, the controller CN may be configured to minimize relative movement between each of the mirrors of the projection system PS. This may be referred to as synchronizing movement of the mirrors such that they all move together at the same time. The controller CN may be configured to apply this synchronization to all of the mirrors of the projection system irrespective of whether a given mirror has a relatively high control bandwidth or a relatively low control bandwidth. With reference to FIG. 6, when this approach is used, a net movement of all of the mirrors M1, M2, M3, M4 relative to the sensor frame F may occur. In general, net movement of mirrors of the projection system relative to a reference system (e.g. a reference frame) may occur. The net movement may be at least partially compensated for via adjustment of the position of the patterning device support structure MT. The position of the substrate table WT may also be correspondingly adjusted. These adjustments may be determined by the controller CN based upon the measured net movement of the mirrors. This approach may advantageously provide a line-of-sight correction. The mirror synchronization embodiment may be combined with other embodiments described in this document.

Although the described embodiments of the invention use sensors to measure the positions of mirrors of the projection system, sensors which measure other properties may be used. For example, sensors which measure acceleration of the mirrors may be used (such sensors may be referred to as accelerometers). Acceleration sensors may provide improved accuracy when determining errors caused by positions of mirrors (the positions of the mirrors may be determined by integrating the measured acceleration). The acceleration sensors may allow improved determination of adjustments to be applied to mirrors of the projection system, adjustments to be applied to the patterning device support structure MT and/or adjustments to be applied to the substrate table WT.

At least some of the embodiments of the invention provide the advantage that they can correct positional drift of mirrors of the projection system PS. This correction may include some feed-forward adjustments of the positions and/or shapes of the mirrors of the projection system PS. The model used by the controller CN may include a model of the positional drift of the mirrors as a function of the temperature of the mirrors. Temperature sensors may be used to measure the temperatures of the mirrors. These temperatures may be used by the controller CN when calculating corrections to be applied to the positions and/or shapes of the mirrors, and/or corrections to be applied to the position of the patterning device support structure MT (and/or to the position of the substrate table WT).

In general, above described embodiments have referred to adjusting the position of the patterning device support structure MT to correct for a residual error. In this circumstance the position of the substrate table WT may be synchronized with the position of the patterning device support structure MT. In an alternative approach, the position of the substrate table WT may be adjusted to correct for a residual error. In this circumstance the position of the patterning device support structure MT may be synchronized with the position of the substrate table WT.

In above described embodiments the mirrors referred to may be considered to be examples of optical elements. Other forms of optical elements may be used.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

In an embodiment, the invention may form part of a mask inspection apparatus. The mask inspection apparatus may use EUV radiation to illuminate a mask and use an imaging sensor to monitor radiation reflected from the mask. Images received by the imaging sensor are used to determine whether or not defects are present in the mask. The mask inspection apparatus may include optics (e.g. mirrors) configured to receive EUV radiation from an EUV radiation source and form it into a radiation beam to be directed at a mask. The mask inspection apparatus may further include optics (e.g. mirrors) configured to collect EUV radiation reflected from the mask and form an image of the mask at the imaging sensor. Said optics may comprise a projection system according to an embodiment of the present invention. The mask inspection apparatus may include a processor configured to analyse the image of the mask at the imaging sensor, and to determine from that analysis whether any defects are present on the mask. The processor may further be configured to determine whether a detected mask defect will cause an unacceptable defect in images projected onto a substrate when the mask is used by a lithographic apparatus.

In an embodiment, the invention may form part of a metrology apparatus. The metrology apparatus may be used to measure alignment of a projected pattern formed in resist on a substrate relative to a pattern already present on the substrate. This measurement of relative alignment may be referred to as overlay. The metrology apparatus may for example be located immediately adjacent to a lithographic apparatus and may be used to measure the overlay before the substrate (and the resist) has been processed.

Embodiments of the invention have been described in the context of radiation sources SO1, SO2, SO3 which output an EUV radiation beam. However a radiation source may be configured to output radiation having any wavelength. Some embodiments of the invention may therefore comprise a radiation source which outputs a radiation beam which is not an EUV radiation beam.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

In general, a projection system according to an embodiment of the present invention may comprise an optical path that is operable to receive an input radiation beam (patterned radiation beam B from the patterning device MA) and to project an output radiation beam onto a substrate W held by the substrate table WT. The optical path comprises a plurality of optical elements. In the above described embodiments, radiation beam B comprises EUV radiation, which is well absorbed by matter. For this reason, in the above described embodiments each of the plurality of optical elements is a mirror. It will be appreciated that for other embodiments (for example those using deep ultra violet radiation, DUV) each of the plurality of optical elements may comprise transmissive optical elements (i.e. lenses). In some other embodiments, the projection system may be a catadioptric system comprising a mixture of reflective and transmissive optical elements.

Although FIGS. 2 and 3 depict laser produced plasma LPP sources and FIG. 5 depicts a free electron laser, any suitable source may be used to generate EUV radiation. For example, EUV emitting plasma may be produced by using an electrical discharge to convert fuel (e.g. tin) to a plasma state. A radiation source of this type may be referred to as a discharge produced plasma (DPP) source. The electrical discharge may be generated by a power supply which may form part of the radiation source or may be a separate entity that is connected via an electrical connection to the radiation source.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A projection system for a lithographic apparatus, the projection system comprising:
   an optical path that is operable to receive an input radiation beam and to project an output radiation beam onto a substrate to form an image, the optical path comprising a plurality of optical elements, the plurality of optical elements comprising a first set of at least two optical elements and a second set of at least one optical element;
   a plurality of sensors, each sensor being associated with one of the plurality of optical elements and operable to determine a position of that optical element;
   a first set of actuators, each actuator in the first set of actuators being associated with one of the second set of optical elements and operable to adjust that optical element; and
   a controller, wherein the controller is configured to use the first set of actuators to adjust the second set of optical elements in dependence on the determined position of the first set of optical elements so as to at least partially compensate for line-of-sight errors caused by the positions of the first set of optical elements,
   wherein the controller is configured to reduce the line-of-sight errors below a specified alignment threshold level.

2. The projection system of claim 1, wherein the controller is configured to use a model to:
   determine an optical aberration caused by the positions of the first set of optical elements; and
   determine an adjustment for the second set of optical elements that at least partially compensates for the determined optical aberration.

3. The projection system of claim 2, wherein one or more of the second set of optical elements is an adjustable optical element and the adjustment determined by the controller comprises a change in the shape of each adjustable optical element.

4. The projection system of claim 1, wherein the controller is configured to receive a signal from each sensor that is indicative of the position of its corresponding optical element.

5. The projection system of claim 1, further comprising a second set of actuators associated with each of the first set of optical elements, each actuator in the second set of actuators is operable to adjust that optical element, wherein the first set of optical elements each has a control bandwidth that is at least a factor of two lower than each of the second set of optical elements.

6. The projection system of claim 1, wherein the specified alignment threshold level is less than 1 nm.

7. The projection system of claim 1, wherein the controller is configured to use the first set of actuators to adjust the second set of optical elements in dependence on the determined position of the first set of optical elements so as to at least partially compensate for optical aberrations caused by the positions of the first set of optical elements, wherein the controller is configured to reduce the optical aberrations below a specified aberration threshold level.

8. The projection system of claim 7, wherein the specified aberration threshold level is 0.02 nm.

9. A lithographic apparatus comprising:
   an illumination system configured to condition a radiation beam;
   a support structure constructed to support a patterning device, the patterning device being capable of imparting the radiation beam with a pattern in its cross-section to form a patterned radiation beam;
   a substrate table constructed to hold a substrate; and
   a projection system comprising:
      an optical path that is operable to receive the patterned radiation beam and to project an output radiation beam onto the substrate to form an image, the optical path comprising a plurality of optical elements, the plurality of optical elements comprising a first set of at least two optical elements and a second set of at least one optical element;
      a plurality of sensors, each sensor being associated with one of the plurality of optical elements and operable to determine a position of that optical element;
      a first set of actuators, each actuator in the first set of actuators being associated with one of the second set of optical elements and operable to adjust that optical element; and
      a controller, wherein the controller is configured to use the first set of actuators to adjust the second set of optical elements in dependence on the determined position of the first set of optical elements so as to at least partially compensate for optical aberrations and/or line-of-sight errors caused by the positions of the first set of optical elements,
      wherein the controller is further configured to control the position of the substrate table in dependence on the determined position of the first set of optical elements so as to at least partially compensate for alignment errors caused by the positions of the first set of optical elements.

10. The lithographic apparatus of claim 9, wherein the optical aberrations and/or line-of-sight errors are reduced by adjusting the second set of the plurality of optical elements, such that a residual error remains, then that residual error is reduced by adjusting the position of the substrate table.

11. The lithographic apparatus of claim 9, wherein the controller is configured to reduce the optical aberrations and/or line-of-sight errors below a specified aberration and/or alignment threshold level.

12. The lithographic apparatus of claim 9, wherein the controller is further configured to control the position of the support structure in dependence on the determined position of the first set of optical elements so as to at least partially compensate for alignment errors caused by the positions of the first set of optical elements.

13. A method for controlling a projection system comprising a plurality of optical elements and a substrate table, the method comprising:
   determining a position of each of the plurality of optical elements;
   using a model to determine an optical aberration and/or line-of-sight error caused by the positions of a first set of at least two of the plurality of optical elements;
   using a model to determine an adjustment for each of a second set of the plurality of optical elements and to determine an adjustment to a position of the substrate table that at least partially compensates for the determined optical aberration and/or line-of-sight error;
applying the determined adjustment to each of the second set of the plurality of optical elements; and
applying the determined adjustment to the position of the substrate table.

14. The method of claim 13, wherein the adjustment for each of the second set of the plurality of optical elements comprises a movement of that optical element.

15. The method of claim 13, wherein the adjustment for each of the second set of the plurality of optical elements comprises a distortion of the shape of that optical element.

16. The method of claim 13, further comprising applying an adjustment to the first set of optical elements.

17. The method of claim 16, wherein the adjustment to the first set of optical elements is applied at a rate that is at least a factor of two lower than a rate at which the adjustments are applied to the second set of optical elements.

18. A method for controlling a lithographic apparatus comprising a patterning device support structure, a projection system comprising a plurality of optical elements, and a substrate table, the method comprising:
determining a position of each optical element in the plurality of optical elements;
using a model to determine a line-of-sight error and/or optical aberration caused by the positions of a first set of at least two of the plurality of optical elements;
using a model to determine an adjustment for each of a second set of the plurality of optical elements and to determine an adjustment to a position of the substrate table that at least partially compensates for the determined line-of-sight error and/or the optical aberration;
applying the determined adjustment to each of the second set of the plurality of optical elements; and
applying the determined adjustment to the position of the substrate table.

19. The method of claim 18, wherein the line-of-sight error and/or optical aberration is reduced by adjusting the second set of the plurality of optical elements, such that a residual error remains, then that residual error is reduced by adjusting the position of the substrate table.

20. The method of claim 18, wherein the method further comprises:
determining an adjustment to a position of the patterning device support structure and the substrate table that at least partially compensates for the determined line-of-sight error and/or the optical aberration;
applying the determined adjustment to each of the second set of the plurality of optical elements; and
applying the determined adjustment to the position of the patterning device support structure and the substrate table.

21. A projection system for a lithographic apparatus, the projection system comprising:
an optical path that is operable to receive an input radiation beam and to project an output radiation beam onto a substrate to form an image, the optical path comprising a plurality of optical elements, the plurality of optical elements comprising a first set of at least two optical elements and a second set of at least one optical element;
a plurality of sensors, each sensor being associated with one of the plurality of optical elements and operable to determine a position of that optical element;
a first set of actuators, each actuator in the first set of actuators being associated with one of the second set of optical elements and operable to adjust that optical element;
a second set of actuators associated with each of the first set of optical elements, each actuator in the second set of actuators is operable to adjust that optical element; and
a controller, wherein the controller is configured to use the first set of actuators to adjust the second set of optical elements in dependence on the determined position of the first set of optical elements so as to at least partially compensate for optical aberrations and/or line-of-sight errors caused by the positions of the first set of optical elements,
wherein the controller is configured to reduce the optical aberrations and/or line-of-sight errors below a specified aberration and/or alignment threshold level,
wherein the first set of optical elements each has a control bandwidth that is at least a factor of two lower than each of the second set of optical elements.

* * * * *

UNITED STATES PATENT AND TRADEMARK OFFICE
CERTIFICATE OF CORRECTION

PATENT NO. : 10,248,027 B2
APPLICATION NO. : 15/525610
DATED : April 2, 2019
INVENTOR(S) : Butler et al.

Page 1 of 1

It is certified that error appears in the above-identified patent and that said Letters Patent is hereby corrected as shown below:

On the Title Page

Under "(30) Foreign Application Priority Data", please change "January 12, 2014" to --December 1, 2014--.

Signed and Sealed this
Eighteenth Day of June, 2019

Andrei Iancu
*Director of the United States Patent and Trademark Office*